(12) United States Patent
Sin et al.

(10) Patent No.: US 9,196,863 B2
(45) Date of Patent: Nov. 24, 2015

(54) ORGANIC LIGHT EMITTING DISPLAY DEVICE AND METHOD OF MANUFACTURING THE SAME

(71) Applicant: Samsung Display Co., Ltd., Yongin, Gyeonggi-Do (KR)

(72) Inventors: Sang-Wook Sin, Yongin (KR); Seon-Young Jung, Yongin (KR); Il-Sang Lee, Yongin (KR); Dong-Jin Kim, Yongin (KR); Jin-Woo Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 163 days.

(21) Appl. No.: 13/972,870

(22) Filed: Aug. 21, 2013

(65) Prior Publication Data

US 2014/0299847 A1    Oct. 9, 2014

(30) Foreign Application Priority Data

Apr. 3, 2013  (KR) .......................... 10-2013-0036439

(51) Int. Cl.
  *H01L 51/52*  (2006.01)
  *H01L 51/56*  (2006.01)
  *H01L 33/56*  (2010.01)

(52) U.S. Cl.
  CPC ....... *H01L 51/5253* (2013.01); *H01L 2251/306* (2013.01)

(58) Field of Classification Search
  CPC .......................... H01L 51/5253; H01L 51/56
  USPC ...................... 257/100, 790; 438/38; 313/511
  See application file for complete search history.

(56) References Cited

U.S. PATENT DOCUMENTS

| | | | |
|---|---|---|---|
| 6,879,319 B2* | 4/2005 | Cok | 345/173 |
| 7,615,506 B2* | 11/2009 | Aitken et al. | 501/44 |
| 7,663,312 B2* | 2/2010 | Anandan | 313/511 |
| 8,115,326 B2* | 2/2012 | Aitken et al. | 257/790 |
| 8,304,990 B2* | 11/2012 | Aitken et al. | 313/512 |
| 8,435,604 B2* | 5/2013 | Aitken et al. | 427/376.1 |
| 8,435,605 B2* | 5/2013 | Aitken et al. | 427/376.1 |
| 8,563,113 B2* | 10/2013 | Edwards et al. | 428/98 |
| 8,679,379 B2* | 3/2014 | Okazaki et al. | 264/1.36 |
| 8,754,434 B1* | 6/2014 | Gollier et al. | 257/98 |
| 8,791,452 B2* | 7/2014 | Park | 257/40 |
| 8,946,754 B2* | 2/2015 | Gollier et al. | 257/98 |
| 2004/0080267 A1* | 4/2004 | Cok | 313/512 |
| 2005/0146267 A1* | 7/2005 | Lee et al. | 313/506 |

(Continued)

FOREIGN PATENT DOCUMENTS

| | | |
|---|---|---|
| KR | 10-2008-0045217 A | 5/2008 |
| KR | 10-2010-0029774 A | 3/2010 |
| KR | 10-2012-0077187 A | 7/2012 |

*Primary Examiner* — Earl Taylor
(74) *Attorney, Agent, or Firm* — Christie, Parker & Hale, LLP

(57) ABSTRACT

In order to provide a robust encapsulating structure, an organic light emitting display device, includes an organic light emitting display device, comprising a substrate, an organic light emitter on the substrate comprising a laminated structure of a first electrode, an organic light emitting layer, and a second electrode, a first inorganic film configured to cover the organic light emitter and being formed from a first inorganic mixture comprising tin oxide, phosphorus oxide and tin fluoride, and a second inorganic film configured to cover the first inorganic film and comprising tin oxide and phosphorus oxide.

20 Claims, 3 Drawing Sheets

(56) References Cited

U.S. PATENT DOCUMENTS

| | | | |
|---|---|---|---|
| 2007/0040501 A1* | 2/2007 | Aitken et al. | 313/512 |
| 2008/0018244 A1* | 1/2008 | Anandan | 313/511 |
| 2008/0206589 A1* | 8/2008 | Aitken et al. | 428/639 |
| 2008/0290798 A1* | 11/2008 | Quesada | 313/512 |
| 2010/0193353 A1* | 8/2010 | Aitken et al. | 204/192.26 |
| 2011/0256334 A1* | 10/2011 | Edwards et al. | 428/69 |
| 2012/0028011 A1* | 2/2012 | An et al. | 428/213 |
| 2012/0045567 A1* | 2/2012 | Aitken et al. | 427/8 |
| 2013/0175558 A1* | 7/2013 | Orsley et al. | 257/88 |
| 2013/0228754 A1* | 9/2013 | Park | 257/40 |
| 2013/0229107 A1* | 9/2013 | Park | 313/504 |
| 2013/0230664 A1* | 9/2013 | Park | 427/523 |
| 2013/0230665 A1* | 9/2013 | Park | 427/535 |
| 2013/0240351 A1* | 9/2013 | Aitken et al. | 204/298.13 |
| 2013/0328480 A1* | 12/2013 | Joo et al. | 313/512 |
| 2014/0120315 A1* | 5/2014 | Aitken et al. | 428/142 |
| 2014/0144772 A1* | 5/2014 | Bellman et al. | 204/192.15 |
| 2014/0151721 A1* | 6/2014 | Orsley et al. | 257/88 |
| 2014/0151729 A1* | 6/2014 | Orsley et al. | 257/98 |
| 2014/0151742 A1* | 6/2014 | Logunov et al. | 257/99 |
| 2014/0291617 A1* | 10/2014 | Kim et al. | 257/40 |
| 2014/0299847 A1* | 10/2014 | Sin et al. | 257/40 |
| 2014/0306188 A1* | 10/2014 | Lee et al. | 257/40 |
| 2014/0312313 A1* | 10/2014 | Lee et al. | 257/40 |
| 2014/0322851 A1* | 10/2014 | Kim et al. | 438/46 |

* cited by examiner

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2013-0036439, filed on Apr. 3, 2013 in the Korean Intellectual Property Office, the disclosure of which is incorporated herein in its entirety by reference.

BACKGROUND

1. Field

One or more embodiments of the present invention relate to an organic light emitting display device including a thin film encapsulator and a method of manufacturing the organic light emitting display device.

2. Description of the Related Art

An organic light emitting display device is a self-light-emitting device which is advantageous for a wide viewing angle, good contrast, and fast response, as well as excellent brightness, drive voltage, and response speed. The organic light emitting display device is able to display various colors.

However, the organic light emitting display device may include organic light emitting diodes (OLEDs), which include organic materials that easily deteriorate, and are vulnerable to moisture, oxygen, etc. Therefore, it is desired that OLEDs have a robust encapsulator to protect them from the external environment.

SUMMARY

Aspects of embodiments of the present invention are directed to an organic light emitting display device including a robust encapsulator and a method of manufacturing the organic light emitting display device.

According to an embodiment of the present invention, there is provided an organic light emitting display device, including: a substrate; an organic light emitter on the substrate including a laminated structure of a first electrode, an organic light emitting layer, and a second electrode; a first inorganic film configured to cover the organic light emitter and being formed from a first inorganic mixture including tin oxide, phosphorus oxide and tin fluoride; and a second inorganic film configured to cover the first inorganic film and including tin oxide and phosphorus oxide.

In one embodiment, a viscosity transition temperature of the first inorganic mixture is lower than a denaturing temperature of the organic light emitter.

In one embodiment, the first inorganic mixture includes the tin oxide in a range of about 45 to 85 mole %.

In one embodiment, the first inorganic film is more solid and dense compared to the second inorganic film.

In one embodiment, the first inorganic film is configured to cover outer surfaces of environmental elements.

In one embodiment, the second inorganic film is less responsive to moisture compared to the first inorganic film.

In one embodiment, each of the first inorganic mixture and the second inorganic film further includes boron phosphate, niobium oxide, tungsten oxide, boron oxide, and/or lead fluoride.

In one embodiment, the organic light emitting display device further includes an underlayer between the organic light emitter and the first inorganic film and including an organic and/or inorganic material.

In one embodiment, the organic light emitting display device further includes an interlayer between the first and second inorganic films and including an organic and/or inorganic material.

In one embodiment, the organic light emitting display device further includes an underlayer between the organic light emitter and the first inorganic film and including an organic or inorganic material and, and an interlayer between the first and second inorganic films and including an organic and/or inorganic material.

According to another embodiment of the present invention, there is provided a method of manufacturing an organic light emitting display device, the method including: forming an organic light emitter to include a laminated structure of a first electrode, an organic light emitter, and a second electrode on a substrate; forming a first inorganic film from a first inorganic mixture including tin oxide, phosphorus oxide and tin fluoride and covering the organic light emitter; and forming a second inorganic film including tin oxide and phosphorus oxide and covering the first inorganic film.

In one embodiment, the forming the first inorganic film includes: forming a first pre-inorganic film by providing the first inorganic mixture on the organic light emitter; heating the first pre-inorganic film at a temperature higher than a viscosity transition temperature of the first inorganic mixture and lower than a denaturing temperature of the organic light emitter; and coagulating the heated first pre-inorganic film to form the first inorganic film.

In one embodiment, the forming the first pre-inorganic film includes providing the first inorganic mixture on the organic light emitter in a sputtering process.

In one embodiment, the first inorganic mixture includes the tin oxide in a range of about 45 to 85 mole %.

In one embodiment, the forming the second inorganic film includes providing the tin oxide and the phosphorous oxide on the first inorganic film in a sputtering process.

In one embodiment, the second inorganic film is less responsive to moisture compared to the first inorganic film.

In one embodiment, in each of the first inorganic mixture and the second inorganic film further include boron phosphate, niobium oxide, tungsten oxide, boron oxide, and/or lead fluoride.

In one embodiment, the method of manufacturing an organic light emitting display device further includes forming an underlayer between the organic light emitter and the first inorganic film and including an organic and/or inorganic material.

In one embodiment, the method of manufacturing an organic light emitting display device further includes forming an interlayer between the first and second inorganic films and including an organic and/or inorganic material.

In one embodiment, the method of manufacturing an organic light emitting display device further includes: forming an underlayer between the organic light emitter and the first inorganic film and including an organic and/or inorganic material; and forming an interlayer between the first and second inorganic films and including an organic and/or inorganic material.

According to an embodiment of the present invention, there is provided the organic light emitting display device that has a sturdy encapsulating structure including the improved first inorganic film and the second inorganic film that is barely responsive to moisture, and the method of manufacturing the organic light emitting display device.

BRIEF DESCRIPTION OF THE DRAWINGS

These and other aspects will become apparent and more readily appreciated from the following description of the embodiments, taken in conjunction with the accompanying drawings of which.

DETAILED DESCRIPTION

Figure 1:
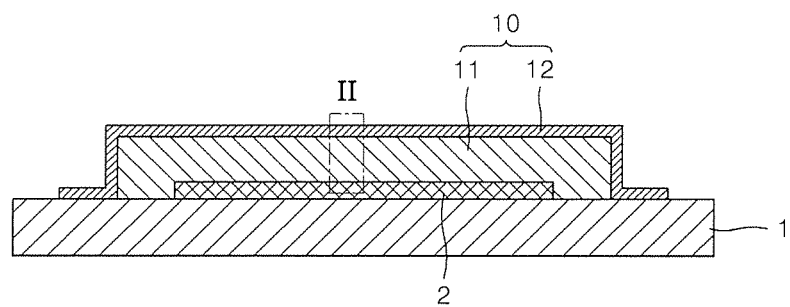
FIG. 1 is a sectional view schematically illustrating an organic light emitting display device, according to an example embodiment of the present invention.

Reference will now be made in detail to embodiments, examples of which are illustrated in the accompanying drawings. Like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

For clear description of the present invention, what are substantially not related to an embodiment of the present invention may not be shown/described or may be only briefly shown/described. Also, for a clear description of various layers and regions in drawings, thicknesses and areas were exaggerated or enlarged.

Throughout the whole specification, same or similar elements are consistently denoted with a same reference numeral. Also, terms such as 'first' and 'second' were used to distinguish an element from another element, and not to limit the present invention. In addition, when a layer, a region, an element, or the like is described to be "on" or "above" another element, the description not only refers to the fact that the element is directly on the other element, but also that there are other layers, regions, elements, or the like existing between the elements.

The present invention will now be described with more details with reference to example embodiments of the present invention as shown in drawings.

Figure 2:
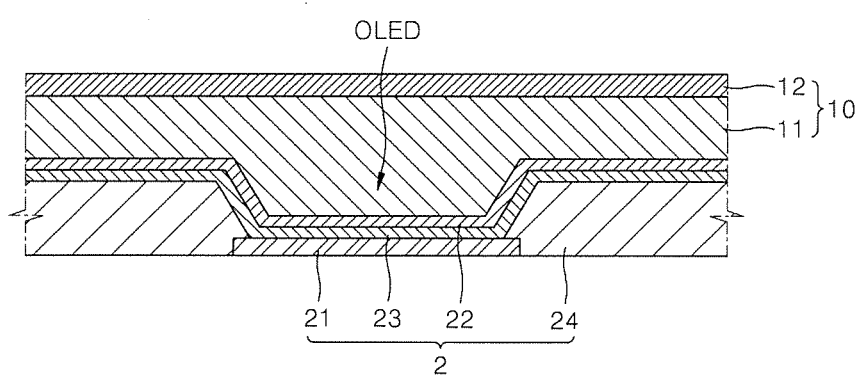
FIG. 2 is an enlarged view of line II of FIG. 1.
Figure 3:
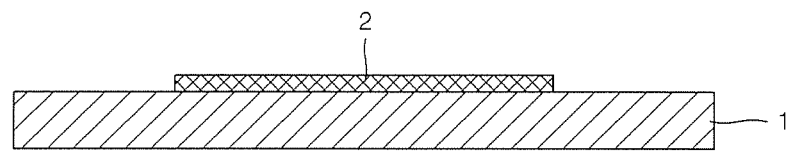
FIGS. 3 to 5 are sectional views illustrating a method of manufacturing the device of FIG. 1, according to an embodiment of the present invention.
Figure 4:
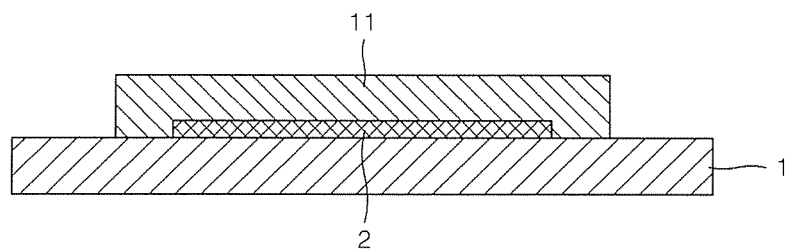
Figure 5:
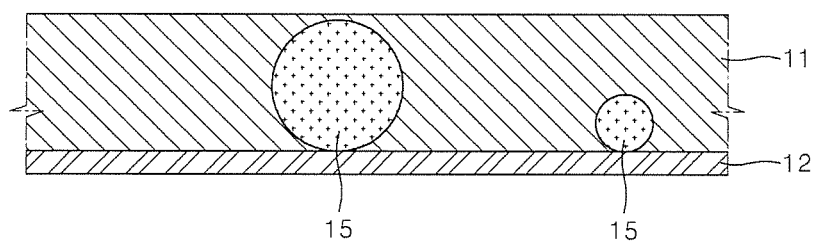

FIG. 1 is a sectional view illustrating an organic light emitting display device, according to an embodiment of the present invention. FIG. 2 is an enlarged view of II of FIG. 1. FIGS. 3 to 5 are sectional views illustrating a method of manufacturing the device of FIG. 1. The following is a description of a structure and a manufacturing method of an organic light emitting display device referring to FIGS. 1 to 5.

Referring to FIGS. 1 and 2, an organic light emitting display device includes a substrate 1, an organic light emitter 2 provided on the substrate 1, and a thin film encapsulator 10 that encapsulates the organic light emitter 2.

The substrate 1 may be formed of a plastic or transparent glass material. The substrate 1 may be rigid, not being able to be bent or folded. However, the substrate 1 may also be flexible or foldable so that the substrate can be bent or folded. The flexible or foldable substrate 1 may be formed of a transparent plastic film and/or a transparent thin glass film.

The organic light emitter 2 includes an organic light emitting diode (OLED). The OLED includes layers of a bottom electrode 21, an interlayer 23, and a top electrode 22. The bottom electrode 21 may be patterned for each pixel and thus be provided in an island form as shown in FIG. 2. However, embodiments of the present invention are not limited to the island form, and in embodiments of the present invention, the bottom electrode 21 may also be in a form of a line or a flat surface.

An insulating film 24 may be further provided on the bottom electrode, covering edges and exposing the center of the bottom electrode 21.

The interlayer 23 is formed on the bottom electrode 21 and includes an organic light emitting layer that illuminates. The interlayer is formed of an organic material. If the bottom electrode 21 functions as an anode, there are provided, between the bottom electrode and the organic light emitting layer, a hole injection layer (HIL) and a hole transport layer (HTL), in that order. Also, in this embodiment, because the top electrode 22 functions as a cathode, there are provided, between the organic light emitting layer and the top electrode 22, an electron transport (ETL) and an electron injection layer (EIL), in that order. Of course, the types, the number, and the order of the functional layers may differ depending on the kinds of organic materials included in the light emitting layer. Also, the bottom electrode 21 and the top electrode 22 may have the opposite electrodes from each other.

The light emitting layer may be patterned for each pixel. Functional layers (such as HIL, HTL, EIL, or ETL) may be commonly formed over the whole substrate as shown in FIG. 2. However, the present invention is not limited to what is shown in FIG. 2. Instead, the organic light emitting layer may be formed on the whole substrate. For example, multiple organic light emitting layers that emit red, green, and blue lights may be layered up perpendicularly or combined (or coupled) together to emit a white light. (Here, color combination for emitting a white light is not limited to that of red, green, and blue) On the other hand, to convert the emitted white light into a different color (e.g., a predetermined color), a color converting layer or a color filter may be separately provided as well.

The top electrode 22 is on the interlayer 23 in an opposite position from the bottom electrode 21. The top electrode 22 may be commonly formed on the whole substrate 1. In case that the organic light emitting display device is a bottom emission device, which means the light is emitted toward the substrate 1, the bottom electrode 21 is formed of a transparent conductive oxide (TCO) such as an indium tin oxide (ITO) so as to be a transparent electrode, and the top electrode 22 is formed of a thick low-resistance metal such as magnesium (Mg) so as to be a reflective electrode. On the contrary, in case the organic light emitting display device is a top emission device, which means the light is emitted toward the opposite side of the substrate 1 (or in a direction facing away from the substrate 1), the bottom electrode 21 further includes a reflective layer such as a silver (Ag) layer so as to be a reflective electrode, and the top electrode 22 is formed of a thin low-resistance metal so as to be a half light-transmitting electrode.

Although not shown in the drawings, there may further be a protective film on the top electrode 22, made of an organic material, to protect the top electrode 22 and to provide a better flat surface. Especially, when the organic light emitting display device is the top emission device, the protective layer having a highly refractive organic film may improve a light extraction ability of the organic light emitting layer by matching the refractive indexes.

Although not shown in FIGS. 1 and 2, when the organic light emitting display device is an active matrix display device, there may further be provided a drive circuit to the organic light emitter 2. The drive circuit is electrically coupled to (or electrically connected to) each OLED and includes at least two thin film transistors (TFT) and at least one capacitor. The drive circuit supplies a driving current to the OLED depending on a signal received through a wire, and thus drives the OLED.

The following is a detailed description of a method of manufacturing the device of FIG. 1 with reference to FIGS. 3 to 5.

Referring to FIG. 3, the organic light emitter is firstly formed on the substrate 1. Because the OLED includes an organic material and thereby is easily deteriorated by the external moisture and oxygen, the organic light emitter has to be protected from external moisture and oxygen. To provide the protection, a thin film encapsulator 10 is formed over the OLED. The encapsulator can be easily bent or folded if the encapsulator is in a form of a thin film.

According to an embodiment of the present invention, the thin film encapsulator 10 is formed of inorganic materials. The thin film encapsulator 10 is formed of multiple inorganic films, e.g., two inorganic films. The thin film encapsulator includes a first inorganic film 11 that covers and encapsulates the organic light emitter 2, and a second inorganic film 12 that covers the first inorganic film 11 and thus encapsulates the organic light emitter.

The first inorganic film 11 is formed of a first inorganic mixture of tin oxide, phosphorus oxide, and tin fluoride. Here, the first inorganic mixture is a low temperature viscosity transition (LVT) inorganic material. It is to be noted that the "temperature" of the LVT does not refer to a temperature that the viscosity of the LVT inorganic material turns from a "solid" state into a perfect "liquid" state; the "temperature" rather refers to a minimum temperature that makes the viscosity of the LVT inorganic material have a least "fluidity".

The viscosity transition temperature of the first inorganic mixture should be lower than a denaturing temperature of the organic light emitter 2. For example, the viscosity transition temperature of the first inorganic mixture is to be about below about 100° C. The denaturing temperature of the organic light emitter 2 means a denaturing temperature of the materials included in the organic light emitter 2, which, more specifically, means a temperature that may alter the chemical and/or physical nature of the materials included in the organic light emitter 2. For instance, the denaturing temperature of the materials included in the organic light emitter 2 may refer to a glass transition temperature (Tg) of organic materials included in the organic layer of the organic light emitter 2. The glass transition temperature (Tg) may be calculated by performing a thermal analysis, using a thermo gravimetric analysis (TGA) and differential scanning calorimetry (DSC), on the materials included in the organic light emitter 2. As a result of the analysis, the glass transition temperature may turn out to be above about 110° C.

The first inorganic mixture may include tin oxide (e.g., SnO or $SnO_2$), phosphorus oxide (e.g., $P_2O_2$), and tin fluoride (e.g., $SnF_2$). In the first inorganic mixture, about 45 to 85 mole % (mole percentage) tin oxide may be included. Here, the sum of mole % of the tin oxide, the phosphorus oxide, the tin fluoride is supposed to be 100% in total.

The tin fluoride lowers the viscosity transition temperature of the first inorganic mixture. If the tin fluoride is included less than 45 mole %, the viscosity transition temperature of the first inorganic mixture is higher than the denaturing temperature of the organic light emitter 2. If so, the organic light emitter 2 is damaged during a healing process, which is going to be further explained later. On the other hand, if the tin fluoride is included more than 85 mole %, the first inorganic film 11 may not be formed from the first inorganic mixture. It is because forming the first inorganic film 11 includes fluidizing the first inorganic mixture and then coagulating the fluidized first inorganic mixture. In this process, the tin oxide and the phosphorus oxide performs a major role; therefore, if the tin fluoride is included more than 85 mole %, the first inorganic mixture is incompletely fluidized and coagulated, thereby making the formation of the first inorganic film 11 impossible.

The first inorganic mixture may further include additional materials; the additional materials may be at least one of tungsten oxide (e.g., $WO_3$), niobium oxide (e.g., NbO, $Nb_2O_2$), boron phosphate ($BPO_4$), and lead fluoride (e.g., $PbF_2$). In one embodiment, the additional materials may not be included in the first inorganic mixture more than 5 mole %. The additional materials improve durability and light transmissibility of the first inorganic film 11, and also may control the surface strength, and adjust the young's modulus and the coefficient of thermal expansion (CTE) of the first inorganic film 11.

On the other hand, the first inorganic mixture may be composed as described in Table 1. Table 1 records values of viscosity transition temperatures depending on respective compositions of the first inorganic mixture.

TABLE 1

| Number | SnO (mole %) | $SnF_2$ (mole %) | $P_2O_5$ (mole %) | $WO_3$ (mole %) | Viscosity transition temperature (° C.) |
|---|---|---|---|---|---|
| 1 | 7.5 | 75.0 | 15.0 | 2.5 | 71 |
| 2 | 12.5 | 60.0 | 25.0 | 2.5 | 90 |
| 3 | 17.5 | 60.0 | 15.0 | 2.5 | 85 |
| 4 | 22.5 | 60.0 | 15.0 | 2.5 | 100 |

The following is a process of forming the first inorganic film 11 and characteristics of the first inorganic film 11.

When forming the first inorganic film 11, first of all, the first pre-inorganic film is formed from the first inorganic mixture so as to cover the organic light emitter 2.

The first pre-inorganic film may be formed by sputtering the first inorganic mixture; more specifically, a layer of an inorganic mixture composed of $SnO—SnF_2—P_2O_5—WO_3$ may be formed by sputtering. The sputtering employs one of a dual rotary target method or a facing target method that uses a direct current (DC) pulse power, and may have a moving substrate for scanning. Here, argon plasma of about 4 kW-20 kW and/or 0.3 Pa-1.5 Pa may be used, and the first pre-inorganic film may be formed in a desired thickness by repeating the scanning multiple times. Thus, the first pre-organic layer is formed in about 1 μm of thickness.

However, the method of forming the first pre-inorganic film is not limited to the above method; the first pre-inorganic film may also be formed by using a method such as evaporation, vacuum deposition, low temperature deposition, plasma enhanced chemical vapor deposition (PCVD), plasma ion assisted deposition (PIAD), slit coating, flash evaporation, electronic beam coating or ion plating.

After forming the first pre-inorganic film, the first pre-inorganic film is healed (e.g., annealed). The healing (e.g., annealing) is performed by heating the first pre-inorganic film in a temperature that is higher than the viscosity transition temperature and lower than the denaturing temperature of the organic light emitter. The viscosity transition temperature of the first pre-inorganic film may differ depending on an amount of the tin fluoride. For example, according to Table 1, the heating of the first pre-inorganic film may be performed in a temperature between about 71° C. and 100° C. for about 1 to 3 hours. By performing the healing in proper temperatures as described above, the first pre-inorganic film may be fluidized and the organic light emitter may be prevented from denaturation. The healing may take place in a vacuum atmosphere, inactive gas atmosphere, such as argon atmosphere, by an infrared ray oven, to prevent the organic light emitter from being exposed to an external environment due to pin holes of the first pre-inorganic film. The healing may also be performed by laser scanning.

Through the healing, the first inorganic mixture included in the first pre-inorganic film may be fluidized. The fluidized first inorganic mixture may have flowability. Therefore, when performing the healing, the following two events may occur:

1) The first inorganic mixture may flow and fill in empty places between environment-generated-elements 15 and the organic light emitter 2. Here, the term environment-generated-elements 15 refer to impure particles that are unavoidably generated from the external environment when forming the organic light emitter. The environment-generated-elements 15 may be microparticles that come from the external environment (e.g., dusts, dirt), or microparticles that remain after forming the organic light emitter 2 (e.g., microparticles of materials used in forming the top electrode 22, which remain after forming the top electrode 22 layer), and/or the like. The environment-generated-elements 15 may be different materials such as organic, inorganic, or organic-inorganic combined materials.

2) The fluidized first inorganic mixture may flow and fill in the pin holes of the first pre-inorganic film.

After the healing, the fluidized first inorganic mixture is coagulated, thereby forming the dense and solid first inorganic film 11 without any pin holes. Pin holes are to be avoided because the pin holes may shorten the life span of the organic light emitting display device; the pin holes may provide rooms for external moisture and oxygen, which eventually creates progressive dark spots, and shrink the thin film encapsulator, etc. In addition to getting rid of the pin holes, the dense and solid first inorganic film 11, after healing, may also completely cover the environment-generated-elements (15), and thus prevent the external moisture and oxygen leak in through spaces that were created from the environment-generated-elements.

To sum up, the first inorganic film 11 that directly contacts the organic light emitter 2 is formed by healing the first inorganic mixture that is fluidized in a temperature lower than the viscosity transition temperature of the organic light emitter. Thus, the first inorganic film is formed in a dense, solid, flawless condition without damaging the organic light emitter.

However, there is a problem caused because the first inorganic film 11 contains tin fluoride. Although the tin fluoride lowers the viscosity transition temperature of the first inorganic film 11, the tin fluoride is highly responsive to moisture. Therefore, if the thin film encapsulator 10 is only formed of the first inorganic film 11, a barrier quality of the thin film encapsulator 10 may decrease by external moisture as time goes by. In order to solve the problem, according to an embodiment of the present invention, a second inorganic film 12 having a good barrier quality (as, e.g., characterized in Table 2, below) is additionally formed on the first inorganic film 11.

The second inorganic film 12 includes tin oxide (e.g., SnO or $SnO_2$) and phosphate oxide (e.g., $P_2O_5$). The second inorganic film 12 does not include tin fluoride (e.g., $SnF_2$). Tin oxide and the phosphate oxide barely respond to moisture and oxygen, and thereby have a good barrier quality against external moisture and oxygen.

The second inorganic film 12 may further include additional materials such as tungsten oxide (e.g. $WO_3$), niobium oxide (e.g., NbO, $Nb_2O_5$), boron phosphate (e.g., $BPO_4$), and/or lead fluoride (e.g., $PbF_2$). However, the second inorganic film 12 may include other additional materials as well.

The second inorganic mixture including the tin oxide and the phosphate oxide is also a low temperature viscosity transition (LVT) inorganic material. However, the viscosity transition temperature of the second inorganic mixture may be higher than the denaturing temperature of the organic light emitter. Therefore, the second inorganic film 12 does not go through the healing process.

The second inorganic mixture may be composed as described in Table 2. Table 2 also records values of barrier quality depending on respective compositions of the second inorganic mixture. For reference, the barrier quality was measured by exposing a sample organic light emitting display device including the second inorganic film 12 that (is included in the thin film encapsulator and) is composed as described in Table 2, for about 1000 hours, in an about 85° C. temperature and 85% humidity environment. After about 1000 hours, the organic light emitting display device was tested to determine if the device had any scotomas (black spots) or had been shrunk or deformed. Referring to Table 2, the second inorganic film 12 maintains an excellent barrier quality (as, e.g., characterized in Table 2, below) even under a high temperature and a high humidity environment.

TABLE 2

| Number | SnO (mole %) | $P_2O_5$ (mole %) | Barrier quality |
|---|---|---|---|
| 1 | 95.0 | 5.0 | Normal |
| 2 | 90.0 | 10.0 | Good |
| 3 | 80.0 | 20.0 | Excellent |
| 4 | 70.0 | 30.0 | Excellent |

The following is a method of manufacturing the second inorganic film.

Referring back to FIG. 1, the second inorganic film 12 is formed from the second inorganic mixture to cover the first inorganic film 11.

The second inorganic film 12 may be formed by sputtering the second inorganic mixture; more specifically, a layer of an inorganic mixture composed of SnO—$P_2O_5$ may be formed by sputtering. The sputtering method may be identical or similar to the method applied for forming the first pre-inorganic film that was described earlier.

However, the method of forming the second inorganic film is not limited to the above method; the second inorganic film may also be formed by using a method such as evaporation, vacuum deposition, low temperature deposition, plasma enhanced chemical vapor deposition (PCVD), plasma ion assisted deposition (PIAD), slit coating, flash evaporation, electronic beam coating or ion plating.

Unlike the first inorganic film 11, the second inorganic film 12 does not go through the healing process. Therefore, the first inorganic film 11 is more solid and dense compared to the second inorganic film 12.

To sum up, according to an embodiment of the present invention, the thin film encapsulator 10 includes the first inorganic film 11 and the second inorganic film 12, and thereby creates a solid encapsulating structure. The first inorganic film 11 may be melted and coagulated, and thus become solid and dense without denaturing the organic light emitter 2 and bury the environment-generated-elements. Also, because the second inorganic film 12 is not very responsive to moisture and oxygen compared to the first organic layer 11, the second inorganic film 12 has an excellent barrier quality.

Figure 6:
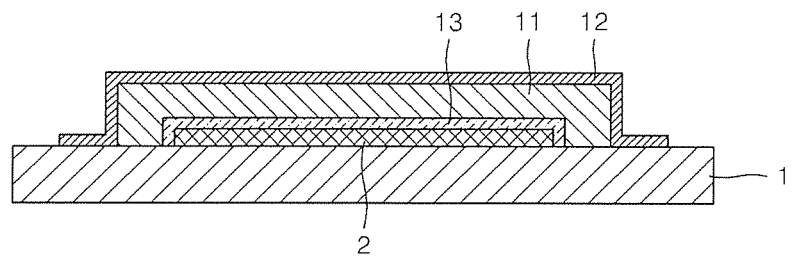
FIG. 6 is a sectional view schematically illustrating an organic light emitting display device, according to another embodiment of the present invention.

FIG. 6 is a sectional view illustrating an organic light emitting display device, according to another embodiment of the present invention. Referring to FIG. 6, an underlayer 13 is further formed between the organic light emitter 2 and the first inorganic film 11. The underlayer 13 is formed directly on the organic light emitter 2, and thereby provides a flat surface over the organic light emitter 2. Also, the underlayer 13 matches coefficients of thermal expansion (CTE) between the organic light emitter 2 and the first inorganic film 11, and thereby prevents a poor interface adhesion caused by differences of CTEs between the upper side of the organic light emitter 2 and the first inorganic film 11. Thus, the underlayer 13 improves the interface adhesion between the organic light emitter 2 and the first inorganic film 11. Furthermore, the underlayer 13 protects the upper side of the organic light emitter 2, such as the top electrode 22 or the protective layer, during the forming of the first pre-inorganic film.

The underlayer 13 may include one or more inorganic and organic materials, and may be formed in a single layer or multiple layers. For example, the underlayer 13 may include tungsten oxide, silicon nitride, silicon compound, and/or one or more monomers of various suitable high molecular substances.

The underlayer 13 may be formed by different methods such as coating, CVD, evaporation, vacuum deposition, or low temperature deposition, however, forming the underlayer 13 is not limited to those methods.

Figure 7:
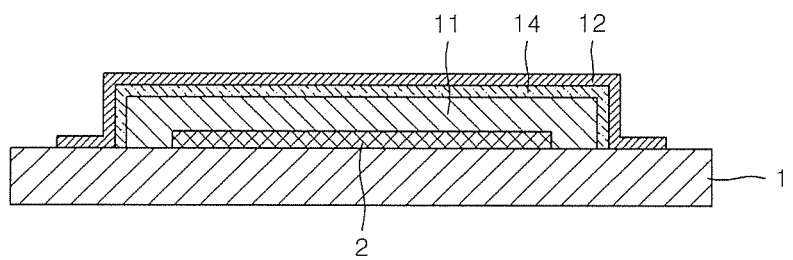
FIG. 7 is a sectional view schematically illustrating an organic light emitting device, according to another embodiment of the present invention.

FIG. 7 is a sectional view illustrating an organic light emitting device, according to another embodiment of the present invention. Referring to FIG. 7, as compared to the embodiment described in FIG. 1, an interlayer 14 is further formed between the first inorganic film 11 and the second inorganic film 12. The interlayer 14 protects the first inorganic film 11 from moisture and oxygen, after forming the first inorganic film 11 and before forming the second inorganic film 12. Further, the interlayer 14 matches the coefficients of thermal expansion (CTEs) between the first and second inorganic films 11 and 12, and thereby strengthens interface adhesion between the first and second inorganic films 11 and 12.

As in the underlayer 13, the interlayer 14 may include one or more inorganic and organic materials, and may be formed in a single layer or multiple layers. For example, the interlayer 14 may include at least one of tungsten oxide, silicon nitride, silicon compound, and/or one or more monomers of various suitable high molecular substances.

The interlayer 14 may be formed by different methods such as coating, CVD, evaporation, vacuum deposition, or low temperature deposition; however, forming the interlayer 14 is not limited to those methods.

Figure 8:
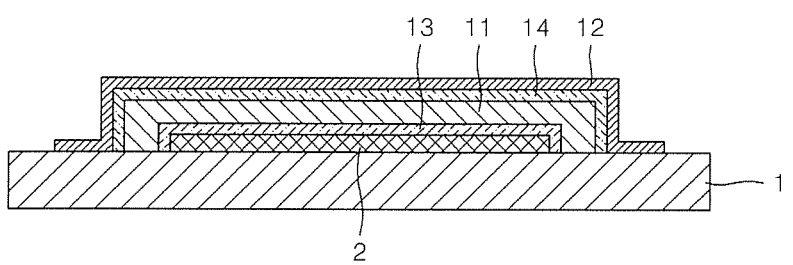
FIG. 8 is sectional view schematically illustrating an organic light emitting device, according to another embodiment of the present invention.

FIG. 8 is a sectional view illustrating an organic light emitting device, according to another embodiment of the present invention. The embodiment shown in FIG. 8 is a combination of the embodiments of FIGS. 6 and 7. The underlayer 13 is provided between the organic light emitter 2 and the first inorganic film 11, and the interlayer 14 is provided between the first and second inorganic films 11 and 12. Forms, compositions, manufacturing methods, materials, functions, and characteristics of the underlayer 13 and the interlayer 14 have already been described above. Therefore, repeat descriptions will not be provided.

While the present invention has been particularly shown and described with reference to embodiments thereof, it will be understood by those of ordinary skill in the art that various suitable changes in form and details may be made therein without departing from the spirit and scope of the present invention as defined by the appended claims and equivalents thereof.

What is claimed is:

1. An organic light emitting display device, comprising:
   a substrate;
   an organic light emitter on the substrate comprising a laminated structure of a first electrode, an organic light emitting layer, and a second electrode;
   a first inorganic film covering the organic light emitter and being formed from a first inorganic mixture comprising tin oxide, phosphorus oxide and tin fluoride; and
   a second inorganic film covering a top surface and a side surface of the first inorganic film and comprising tin oxide and phosphorus oxide.

2. The organic light emitting display device of claim 1, wherein a viscosity transition temperature of the first inorganic mixture is lower than a denaturing temperature of the organic light emitter.

3. The organic light emitting display device of claim 1, wherein the first inorganic mixture comprises the tin oxide in a range of about 45 to 85 mole %.

4. The organic light emitting display device of claim 1, wherein the first inorganic film is more solid and dense compared to the second inorganic film.

5. The organic light emitting display device of claim 1, wherein the first inorganic film is configured to cover outer surfaces of environmental elements.

6. The organic light emitting display device of claim 1, wherein the second inorganic film is less responsive to moisture compared to the first inorganic film.

7. The organic light emitting display device of claim 1, wherein each of the first inorganic mixture and the second inorganic film further comprises boron phosphate, niobium oxide, tungsten oxide, boron oxide, and/or lead fluoride.

8. The organic light emitting display device of claim 1, further comprising:
   an underlayer between the organic light emitter and the first inorganic film and comprising an organic and/or inorganic material.

9. An organic light emitting display device, comprising:
   a substrate;
   an organic light emitter on the substrate comprising a laminated structure of a first electrode, an organic light emitting layer, and a second electrode;
   a first inorganic film configured to cover the organic light emitter and being Banned from a first inorganic mixture comprising tin oxide, phosphorus oxide and tin fluoride;
   a second inorganic film configured to cover the first inorganic film and comprising tin oxide and phosphorus oxide; and an interlayer between the first and second inorganic films and comprising an organic and/or inorganic material.

10. An organic light emitting display device, comprising:
a substrate;
an organic light emitter on the substrate comprising a laminated structure of a first electrode, an organic light emitting layer, and a second electrode;
a first inorganic film configured to cover the organic light emitter and being formed from a first inorganic mixture comprising tin oxide, phosphorus oxide and tin fluoride;
a second inorganic film configured to cover the first inorganic film and comprising tin oxide and phosphorus oxide;
an underlayer between the organic light emitter and the first inorganic film and comprising an organic or inorganic material and; and
an interlayer between the first and second inorganic films and comprising an organic and/or inorganic material.

11. A method of manufacturing an organic light emitting display device, the method comprising:
forming an organic light emitter to comprise a laminated structure of a first electrode, an organic light emitter, and a second electrode on a substrate;
forming a first inorganic film from a first inorganic mixture comprising tin oxide, phosphorus oxide and tin fluoride and covering the organic light emitter; and
forming a second inorganic film comprising tin oxide and phosphorus oxide and covering a top surface and a side surface of the first inorganic film.

12. A method of manufacturing an organic light emitting display device, the method comprising:
forming an organic light emitter to comprise a laminated structure of a first electrode, an organic light emitter, and a second electrode on a substrate;
forming a first inorganic film from a first inorganic mixture comprising tin oxide, phosphorus oxide and tin fluoride and covering the organic light emitter; and
forming a second inorganic film comprising tin oxide and phosphorus oxide and covering the first inorganic film,
wherein the forming the first inorganic film comprises:
forming a first pre-inorganic film by providing the first inorganic mixture on the organic light emitter;
heating the first pre-inorganic film at a temperature higher than a viscosity transition temperature of the first inorganic mixture and lower than a denaturing temperature of the organic light emitter; and
coagulating the heated first pre-inorganic film to form the first inorganic film.

13. The method of claim 12, wherein the forming the first pre-inorganic film comprises providing the first inorganic mixture on the organic light emitter in a sputtering process.

14. The method of manufacturing the organic light emitting display device of claim 11, wherein the first inorganic mixture comprises the tin oxide in a range of about 45 to 85 mole %.

15. The method of claim 11, wherein the forming the second inorganic film comprises providing the tin oxide and the phosphorous oxide on the first inorganic film in a sputtering process.

16. The method of claim 11, wherein the second inorganic film is less responsive to moisture compared to the first inorganic film.

17. The method of claim 11, wherein each of the first inorganic mixture and the second inorganic film further comprise boron phosphate, niobium oxide, tungsten oxide, boron oxide, and/or lead fluoride.

18. The method of claim 11, further comprising:
forming an underlayer between the organic light emitter and the first inorganic film and comprising an organic and/or inorganic material.

19. A method of manufacturing an organic light emitting display device, the method comprising:
forming an organic light emitter to comprise a laminated structure of a first electrode, an organic light emitter, and a second electrode on a substrate;
forming a first inorganic film from a first inorganic mixture comprising tin oxide, phosphorus oxide and tin fluoride and covering the organic light emitter;
forming a second inorganic film comprising tin oxide and phosphorus oxide and covering the first inorganic film; and
forming an interlayer between the first and second inorganic films and comprising an organic and/or inorganic material.

20. A method of manufacturing an organic light emitting display device, the method comprising:
forming an organic light emitter to comprise a laminated structure of a first electrode, an organic light emitter, and a second electrode on a substrate;
forming a first inorganic film from a first inorganic mixture comprising tin oxide, phosphorus oxide and tin fluoride and covering the organic light emitter;
forming a second inorganic film comprising tin oxide and phosphorus oxide and covering the first inorganic film; and
forming an underlayer between the organic light emitter and the first inorganic film and comprising an organic and/or inorganic material; and
forming an interlayer between the first and second inorganic films and comprising an organic and/or inorganic material.

* * * * *